(12) United States Patent
Murukesan et al.

(10) Patent No.: US 9,680,009 B2
(45) Date of Patent: Jun. 13, 2017

(54) HIGH VOLTAGE SEMICONDUCTOR DEVICE

(71) Applicant: TAIWAN SEMICONDUCTOR MANUFACTURING COMPANY LTD., Hsinchu (TW)

(72) Inventors: Karthick Murukesan, Hsinchu (TW); Yi-Cheng Chiu, New Taipei (TW); Hung-Chou Lin, Yunlin County (TW); Chih-Yuan Chan, Kaohsiung (TW); Yi-Min Chen, Hsinchu (TW); Chen-Chien Chang, Hsinchu County (TW); Chiu-Hua Chung, Hsinchu (TW); Fu-Chih Yang, Kaohsiung County (TW); Chun Lin Tsai, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/926,582

(22) Filed: Oct. 29, 2015

(65) Prior Publication Data

US 2017/0125582 A1    May 4, 2017

(51) Int. Cl.
*H01L 29/10* (2006.01)
*H01L 29/78* (2006.01)
*H01L 29/40* (2006.01)

(52) U.S. Cl.
CPC ...... *H01L 29/7816* (2013.01); *H01L 29/1083* (2013.01); *H01L 29/1095* (2013.01); *H01L 29/402* (2013.01)

(58) Field of Classification Search
CPC ............ H01L 29/7816; H01L 29/1083; H01L 29/1095; H01L 29/402
See application file for complete search history.

(56) References Cited

U.S. PATENT DOCUMENTS

| | | | |
|---|---|---|---|
| 8,629,513 B2 | 1/2014 | Su et al. | |
| 2004/0232522 A1* | 11/2004 | Shimizu | H01L 21/763 257/548 |
| 2012/0242400 A1* | 9/2012 | Shaeffer | H01L 21/823892 327/536 |

* cited by examiner

*Primary Examiner* — Fernando L Toledo
*Assistant Examiner* — Valerie N Newton
(74) *Attorney, Agent, or Firm* — WPAT, P.C., Intellectual Property Attorneys; Anthony King

(57) ABSTRACT

In some embodiments, a semiconductor device includes a transistor, an isolation component, and a conductive layer. The transistor includes a source region and a drain region. The isolation component surrounds the source region. The conductive layer is configured for interconnection of the drain region. The conductive component is between the conductive layer and the isolation component, configured to shield the isolation component from an electric field over the isolation component.

20 Claims, 15 Drawing Sheets

US 9,680,009 B2

HIGH VOLTAGE SEMICONDUCTOR DEVICE

BACKGROUND

High voltage or ultrahigh voltage metal-oxide-semiconductor (MOS) transistor devices have been widely used for various applications. Ultra-high voltage metal-oxide-semiconductor field effect transistors (MOSFET) are typically fabricated with coplanar drain and source regions. Ordinarily, an ultrahigh voltage MOS transistor device can sustain a drain voltage of several hundreds, such as 300 volts or above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
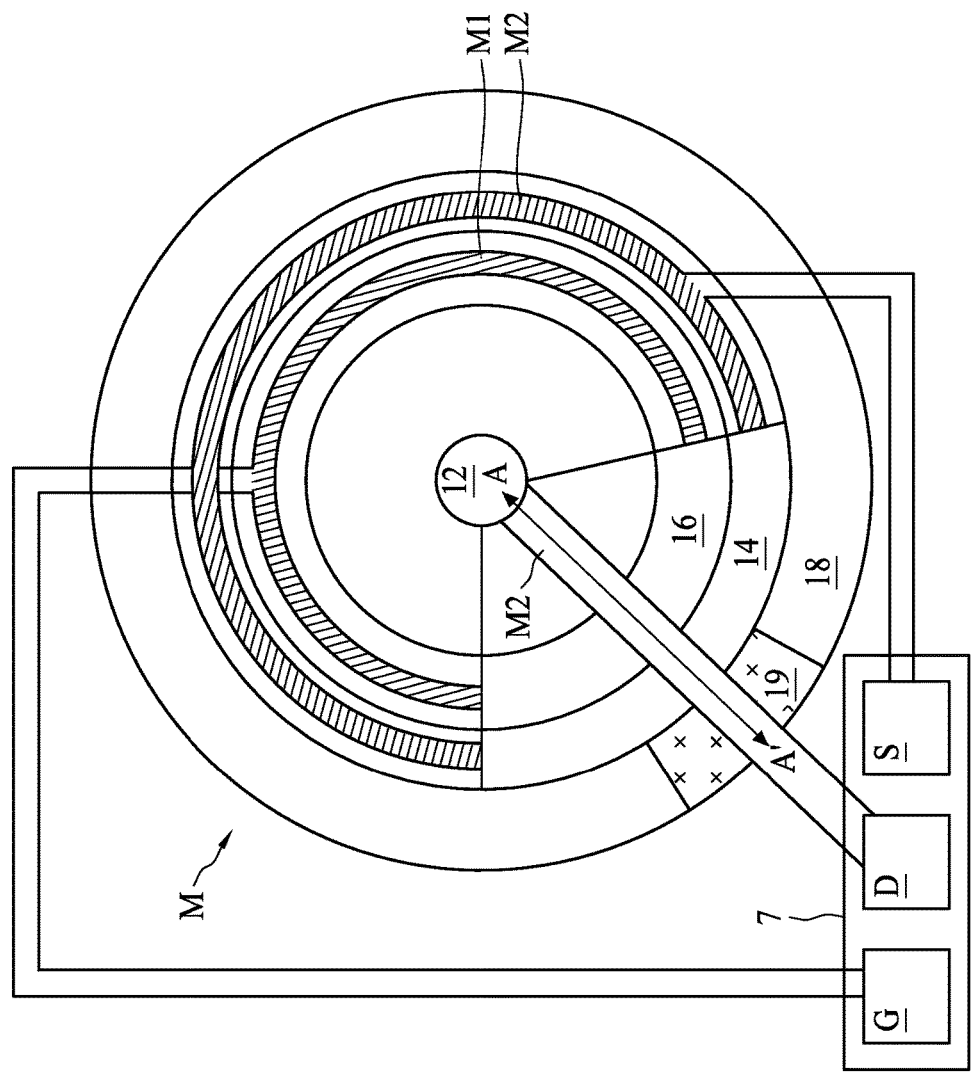
FIG. 1A is a layout top view of a semiconductor device, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a layout top view of a semiconductor device 1, in accordance with some embodiments of the present disclosure. Referring to FIG. 1A, the semiconductor device 1 includes a transistor M including a drain region 12, a gate 16 and a source region 14. In the present embodiment, the drain region 12 takes the form of a circle, while the source region 14 and the gate 16 take the form of a ring. Moreover, the drain region 12 is surrounded by the gate 16, which in turn is surrounded by the source region 14. Furthermore, the source region 14 is surrounded by an isolation component 18. The isolation component 18 is configured to isolate electrical communication between the source region 14 and another electronic component, such as another transistor.

The gate 16 is coupled to a first conductive layer M1 for interconnection, the source region 14 is coupled to a second conductive layer M2 for interconnection, and the drain region 12 is coupled to the second conductive layer M2 for interconnection. Furthermore, a connection area 7, including pickup regions D, S and G, separate from the transistor M is provided to facilitate interconnection of the drain region 12, source region 14 and gate 16, respectively.

A portion of the first conductive layer M1 takes the form of a discontinuous ring over the ring-shape gate 16. Moreover, a portion of the second conductive layer M2 extends in the AA' direction between the drain region 12 and the connection area 7. It is noted that if the second conductive layer M2 were to overlap the first conductive layer M1 at the discontinuous section, an undesirable coupling effect between the second conductive layer M2 and the first conductive layer M1 would occur. To avoid such an issue, where the second conductive layer M2 overlaps the first conductive layer M1, the first conductive layer M1 is removed.

During operation of the transistor M, a current may flow through the second conductive layer M2 and a relatively strong electric filed is established, which may cause degradation on voltage level of the source region 14. To alleviate or eliminate the degradation, a conductive component 19 is disposed on or over the isolation component 18, which will be described in detail with reference to FIG. 1B.

In an embodiment, the transistor M includes a metal-oxide-semiconductor field-effect transistor (MOSFET). In another embodiment, the transistor M includes a high voltage MOSFET capable of operating at 700 volts or above. Alternatively, the transistor M includes bipolar junction transistors (BJTs), complementary MOS (CMOS) transistors, etc. Moreover, the transistor M can be used in a power device, such as a power diode and a thyristor. In an embodiment, the isolation component 18 includes a shallow trench isolation (STI) structure. In another embodiment, the isolation component 18 includes a local oxidation of silicon (LOCOS) structure. In still another embodiment, the isolation component 18 includes a field oxide (FOX) structure.

Figure 1B:
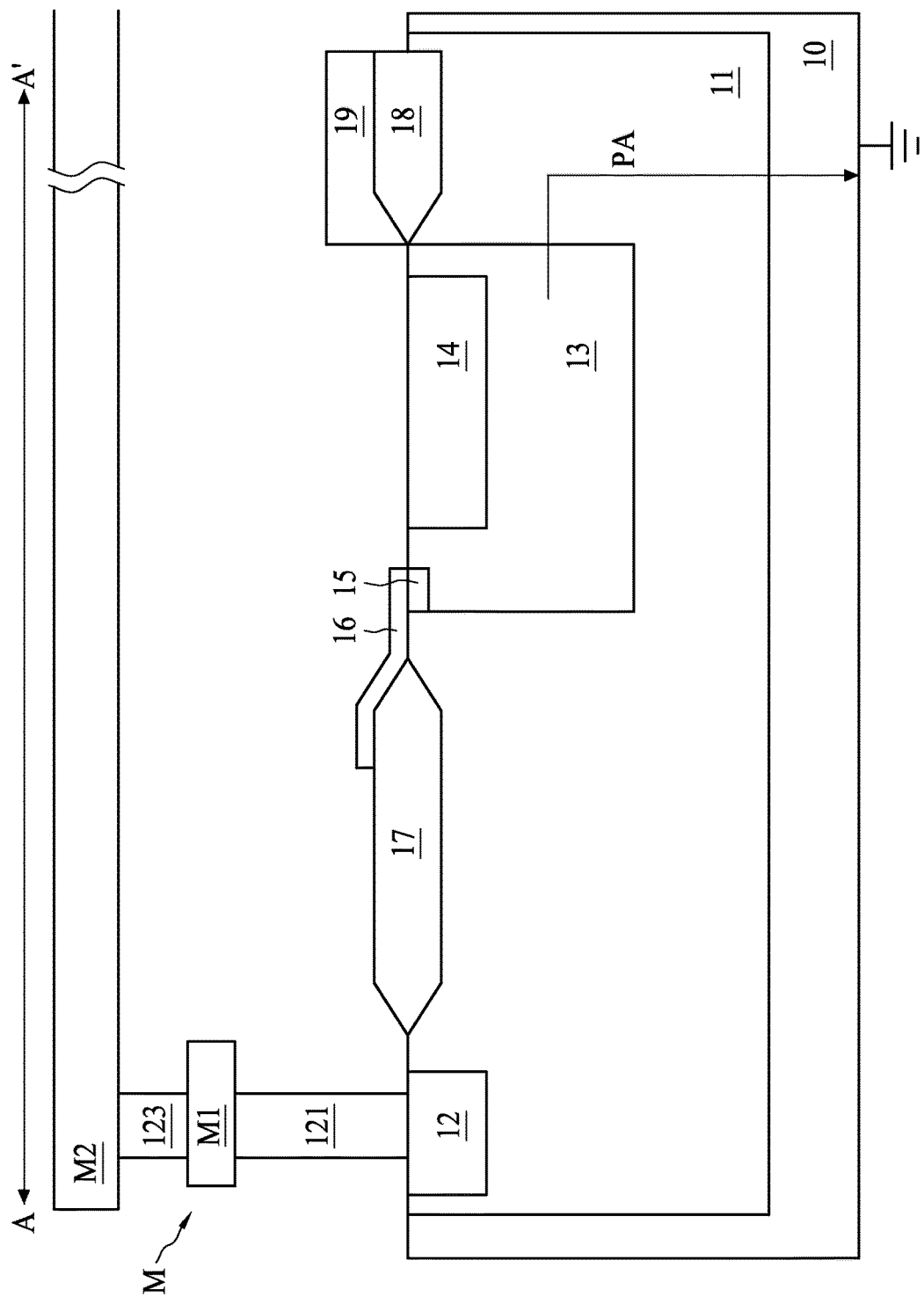
FIG. 1B is a cross-sectional view of the semiconductor device as shown in FIG. 1A taken along a line A-A', in accordance with some embodiments of the present disclosure.

FIG. 1B is a cross-sectional view of the semiconductor device 1 as shown in FIG. 1A taken along a line A-A', in accordance with some embodiments of the present disclosure. Referring to FIG. 1B, the semiconductor device 1 includes a substrate 10 and well regions 11 and 13, in addition to the transistor M, the isolation component 18 and the conductive component 19.

The drain region 12 of the transistor M is formed in the well 11 in the substrate 10. Moreover, the source region 14 of the transistor M is formed in the well 13 within the well 11. Furthermore, the gate 16 of the transistor M is disposed over the well 11 and extends on an isolation component 17. A channel region 15 is defined under the gate 16 between the drain region 12 and the source region 14 in the well 11. The dopant type of the well 13 is opposite to that of the well 11. For example, when the well 13 is p-type, then the well 11 is n-type. Alternatively, when the well 13 is n-type, then the well 11 is p-type. In some embodiments, the well 11 is a high voltage n-well. Similar to the isolation component 18, the isolation component 17 may include one of an STI, LOCOS and FOX structure.

The drain region 12 is coupled, through a contact 121, the first conductive layer M1, a via 123 and the second conductive layer M2, to the connection area 7 shown in FIG. 1A. The isolation component 17 defines a length of the drain region 12.

In some embodiments, the substrate 10 includes silicon germanium, gallium arsenic, silicon carbon, or other suitable semiconductor materials. In some embodiments, the substrate 10 further includes doped regions such as a P-well and an N-well (not shown). In some other embodiments, the substrate 10 further includes other features such as a buried layer, or an epitaxy layer. Furthermore, in some embodiments, the substrate 10 is semiconductor on insulator such as silicon on insulator (SOI). In other embodiments, the semiconductor substrate 10 includes a doped epi layer, a gradient semiconductor layer, or further includes a semiconductor layer overlying another semiconductor layer of a different type such as a silicon layer on a silicon germanium layer. In some other examples, a compound semiconductor substrate includes a multilayer silicon structure or a silicon substrate may include a multilayer compound semiconductor structure. In some embodiments, the substrate 10 may include other elementary semiconductors such as germanium and diamond. In some embodiments, the substrate 10 includes a compound semiconductor such as silicon carbide, gallium arsenide, indium arsenide, or indium phosphide.

In addition, the substrate 10 is doped with a dopant of p-type and the drain region 12 and source region 14 are doped with a dopant of n-type. As such, the substrate 10, the drain region 12 and source region 14 define an n-type semiconductor device, such as an n-channel metal-oxide-semiconductor field effect transistor (MOSFET). Alternatively, for example, the substrate 10 is doped with a dopant of n-type and the drain region 12 and source region 14 are doped with a dopant of p-type. As such, the substrate 10, the drain region 12 and source region 14 define a p-type semiconductor device, such as a p-channel metal-oxide-semiconductor field effect transistor (MOSFET).

It should be noted that a drain region and a source region are interchangeable depending on a voltage applied thereto. In an n-type metal-oxide-semiconductor field-effect transistor (NMOS), a drain receives a first voltage, and a source receives a second voltage lower than the first voltage. In a p-type metal-oxide-semiconductor field-effect transistor (PMOS), a drain receives a first voltage, and a source receives a second voltage higher than the first voltage.

The conductive component 19, disposed on the isolation component 18, is configure to alleviate the effect of an electric filed established by the second conductive layer M2 on the isolation component 18. Specifically, when the transistor M is enabled, for example, in response to a pulse signal, a current may flow from the drain region 12 to the second conductive layer M2. Accordingly, electrons in the second conductive layer M2 establish the electric filed, which affects the electric characteristic of the transistor M, especially the isolation component 18. With the conductive component 19 disposed between the second conductive layer M2 and the isolation component 18, the isolation component 18 is shielded, by the conductive component 19, from the electric field. Effectively, the effect of the electric filed on the isolation component 18 is weakened or even eliminated.

Advantages of the conductive component 19 are discussed below by way of comparison between an existing approach without such conductive component 19 and the transistor M. In some existing transistors free of a protective layer (or a barrier layer) such as the conductive component 19, an electric field established by an interconnect structure such as the second conductive layer M2 would adversely affect an isolation component, such as the isolation component 18, disposed adjacent to a source region of the transistors. Consequently, serious degradation on the voltage level at the source region may very likely to occur.

For an example of the existing transistor, assume that the semiconductor device 1 is not provided with the conductive component 19. Assume that the substrate 10 is a p-type substrate, the well 11 is an n-well and the well 13 is a p-well. Since the electric field is very strong due to an ultra-high voltage, negative charge in the n-well 11 is accelerated by the electric field, injected from the n-well 11 to the isolation component 18 and trapped in the isolation component 18 due to quantum mechanical direct tunneling or fowler-nordheim tunneling. The trapped negative charge in the isolation component 18 depletes the n-well 11 near the isolation component 18, resulting in positive charge in the n-well 11. Consequently, punch-through occurs in the n-well 11 under the isolation component 18, leading to leakage from the p-well 13 via the n-well 11 under the isolation component 18 towards the substrate 10, as indicated by a leakage current path PA. As a result, the voltage level at the source region 14 is decreased (i.e., degradation) when the transistor M is enabled.

In FIG. 1B, given the fact that the substrate 10 is a p-type substrate, the well 11 is an n-well and the well 13 is a p-well, since the electric field is shielded, when a relatively high voltage is applied during the operation of the transistor M, negative charge in the n-well 11 is not accelerated by the electric field and therefore is not injected from the n-well 11 to the isolation component 18. The negative charge still remains in the n-well 11. Accordingly, no depletion occurs in the n-well 11 under the isolation component 18, and no punch-through in the n-well 11 under the isolation component 18. Effectively, no such leakage current path PA from the p-well 13 to the substrate 10 exists. As a result, the voltage level at the source region 14 can substantially be kept intact and thus no degradation occurs when the transistor M is enabled.

In the present embodiment, the conductive component 19 is disposed on the entire isolation component 18. That is, the conductive component 19 covers approximately 100% of the isolation component 18. In another embodiment, the conductive component 19 covers a portion of the isolation component 18. For example, the conductive component 19 may cover approximately 20% of the isolation component 18. Alternatively, the conductive component 19 may cover approximately 50% of the isolation component 18. The greater the coverage area is, the better the performance on anti-degradation is achieved. Accordingly, the conductive component 19 that covers the entire isolation component 18 has better performance than that covers 20% of the isolation component 18. In some embodiments, the conductive component 19 is extended to overlap a portion of the source region 14 adjacent to the isolation component 18.

Figure 2:
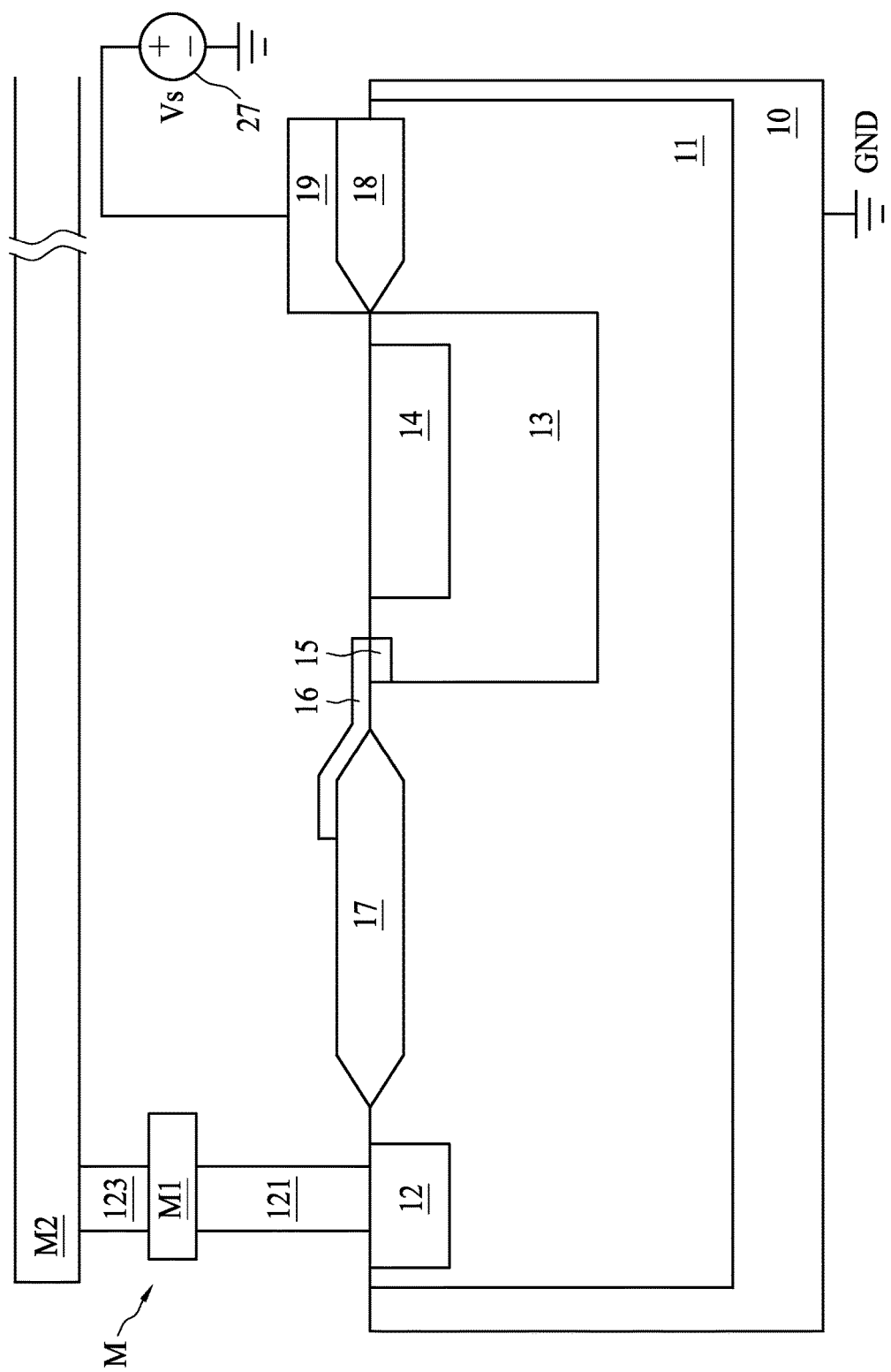
FIG. 2 is a diagram of a semiconductor device, in accordance with some embodiments of the present disclosure.

FIG. 2 is a diagram of a semiconductor device 2, in accordance with some embodiments of the present disclosure. Referring to FIG. 2, the semiconductor device 2 is similar to the semiconductor device 1 described and illustrated with reference to FIG. 1B except that, for example, the semiconductor device 2 includes a voltage source 27.

The voltage source 27 is configured to provide a voltage Vs to the conductive component 19. Since the voltage level of the conductive component 19 serving as a shield component is Vs, a source floating capability (SFC) of the transistor M is enhanced, as will be further discussed below. Source floating capability refers to a voltage level at which a source terminal of a transistor can float. The higher the voltage level at the source terminal of the transistor, the better the source floating capability.

Assuming that the substrate 10 is a p-type substrate, the well 11 is an n-well and the well 13 is a p-well, the majority carrier in the n-well 13 is electron, while the majority carrier in the p-well 11 is electron hole. When the voltage Vs is applied to the conductive component 19, the conductive component 19 induces negative charge from the reference ground GND through the substrate 10 to the n-well 11. The negative charge is accumulated in the n-well 11. Specifically, the conductive component 19 raised to the voltage level Vs facilitates accumulation of negative charge in a part of the n-well 11 adjacent to the p-well 13. The negative charge has the same electrical type as the majority carrier in the n-well 11. Accordingly, the amount of negative-type charge in the n-well 11 in a condition that the conductive component 19 is biased is greater than that in a condition that the conductive component 19 is floating. The accumulated negative-type charge facilitates to block the leakage current path PA. Effectively, the source floating capability is enhanced.

The enhanced source floating capability enables the source of the transistor M to operate at a higher voltage level and the transistor M to be more power efficient. Specifically, when the transistor M is disabled, the source voltage of the transistor M at a higher level causes the gate-to-source voltage (VGS) of the transistor M to accordingly decrease. As a result, leakage current from the disabled transistor M is reduced or even eliminated, and the transistor M has no parasitic power dissipation resulting from the leakage current. The semiconductor device 2 not only prevents the degradation on the voltage level at the source region 14 of the transistor M, but also enhances the source floating capability.

In some existing power devices, an ultrahigh voltage NMOS transistor is used as a switch to selectively connect the power devices to an ultrahigh supply voltage, such as 600 volts (V) or even 800 V. A drain terminal of the ultrahigh voltage NMOS transistor generally would receive the ultrahigh supply voltage and therefore is designed to endure the ultrahigh supply voltage. Consequently, a person having ordinary skill in the art would focus on the design of electric characteristics of the drain terminal, and may ignore the source terminal of the ultrahigh voltage NMOS transistor. Therefore, the source floating capability of the existing ultrahigh voltage NMOS transistor may be undesirable or relatively poor. As a result, the existing ultrahigh voltage NMOS transistor has a leakage current path, such as the leakage current path PA as previously discussed, to allow a leakage current to flow therein, hence resulting in the power dissipation at certain operation conditions.

Figure 3:
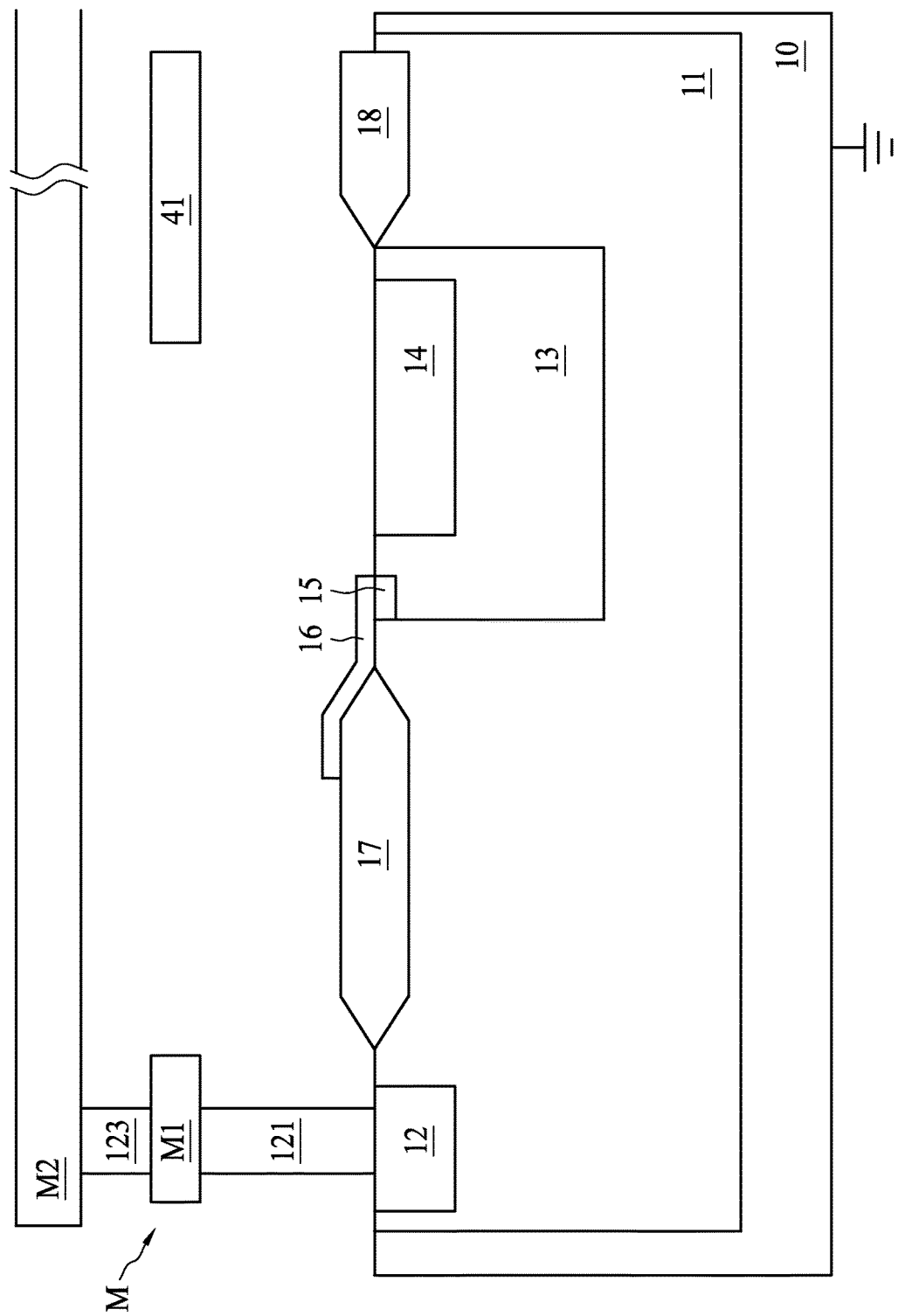
FIG. 3 is a diagram of a semiconductor device, in accordance with some embodiments of the present disclosure.

FIG. 3 is a diagram of a semiconductor device 3, in accordance with some embodiments of the present disclosure. Referring to FIG. 3, the semiconductor device 3 is similar to the semiconductor device 1 described and illustrated with reference to FIG. 1B except that, for example, the semiconductor device 3 replaces the conductive component 19 with a conductive component 41.

Unlike the conductive component 19 that is disposed on the isolation component 18, the conductive component 41 is disposed over the isolation component 18. The conductive component 41 is configured to alleviate the effect of an electric filed established by the second conductive layer M2 on the isolation component 18. For similar reasons as provided in the embodiment of FIG. 1B, since the conductive component 41 is disposed between the second conductive layer M2 and the isolation component 18, the isolation component 18 is shielded by the conductive component 41 from the electric field. Effectively, the effect of the electric filed on the isolation component 18 is weakened or even eliminated. As a result, degradation on a voltage level at the source region 14 is alleviated or even eliminated.

Furthermore, in some embodiments, the conductive component 41 is extended to overlap a portion of the source region 14 adjacent to the isolation component 18. Effectively, undesirable effects, such as point discharge resulting from a bird's beak at the edge of the isolation component 18 that may include the LOCOS or the FOX structure, can be avoided.

Figure 4:
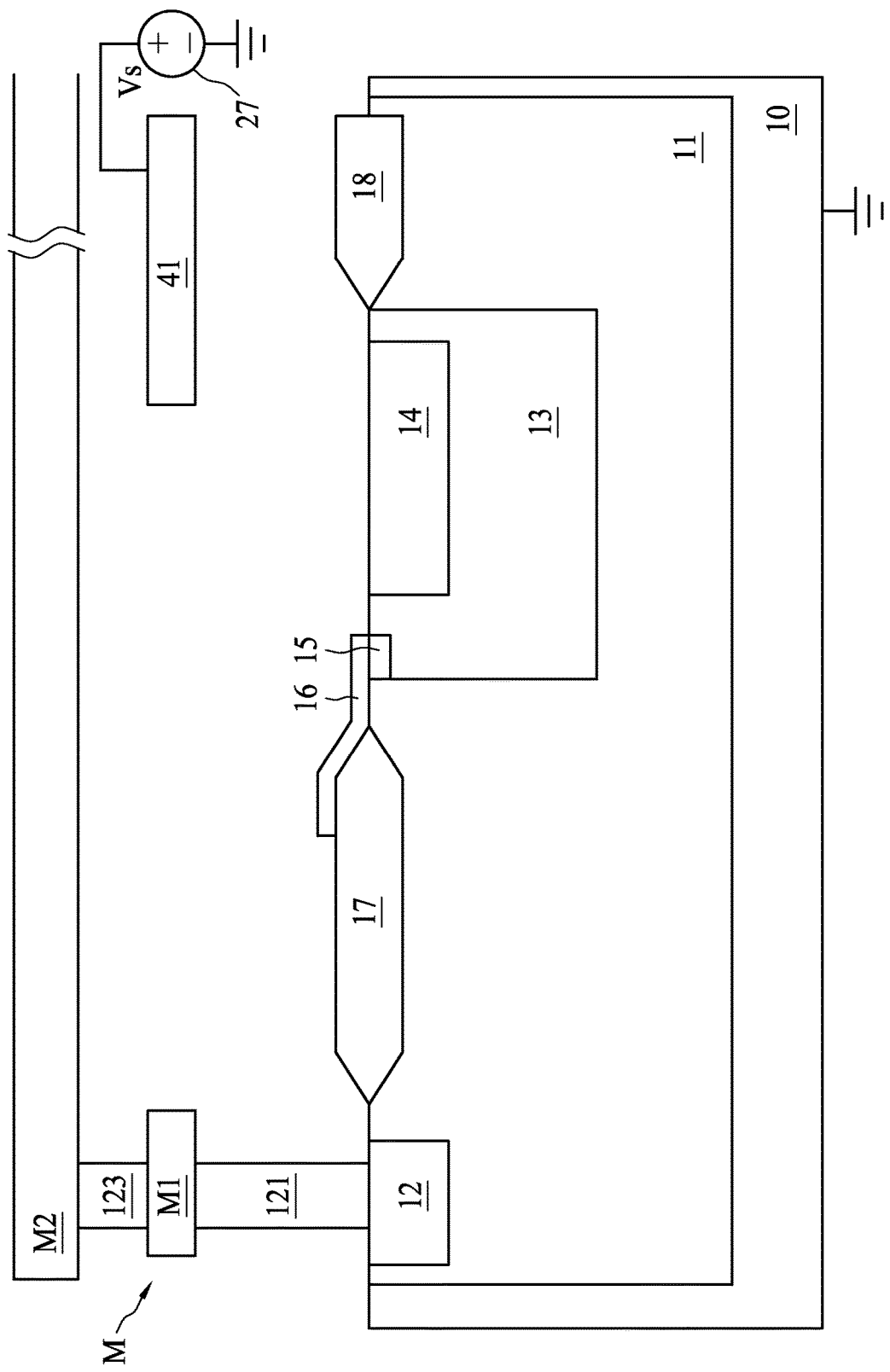
FIG. 4 is a diagram of a semiconductor structure, in accordance with some embodiments of the present disclosure.

FIG. 4 is a diagram of a semiconductor device 4, in accordance with some embodiments of the present disclosure. Referring to FIG. 4, the semiconductor device 4 is similar to the semiconductor device 3 described and illustrated with reference to FIG. 3 except that, for example, the semiconductor device 4 further includes a voltage source 27.

The voltage source 27 is configured to provide a voltage Vs to the conductive component 41. The conductive component 41 raised to the voltage Vs facilitates accumulation of charge in the well 11. Accordingly, source floating capability (SFC) of the transistor M is enhanced. For the similar reasons as provided in the embodiment of FIG. 2, as a result of the enhanced source floating capability, leakage current in the disabled transistor M is reduced or even eliminated and thus the transistor M has no parasitic power dissipation resulting from the leakage current. Accordingly, the semiconductor device 4 not only prevents the degradation on the voltage level of the source region 14 of the transistor M, but also enhances the source floating capability.

Figure 5A:
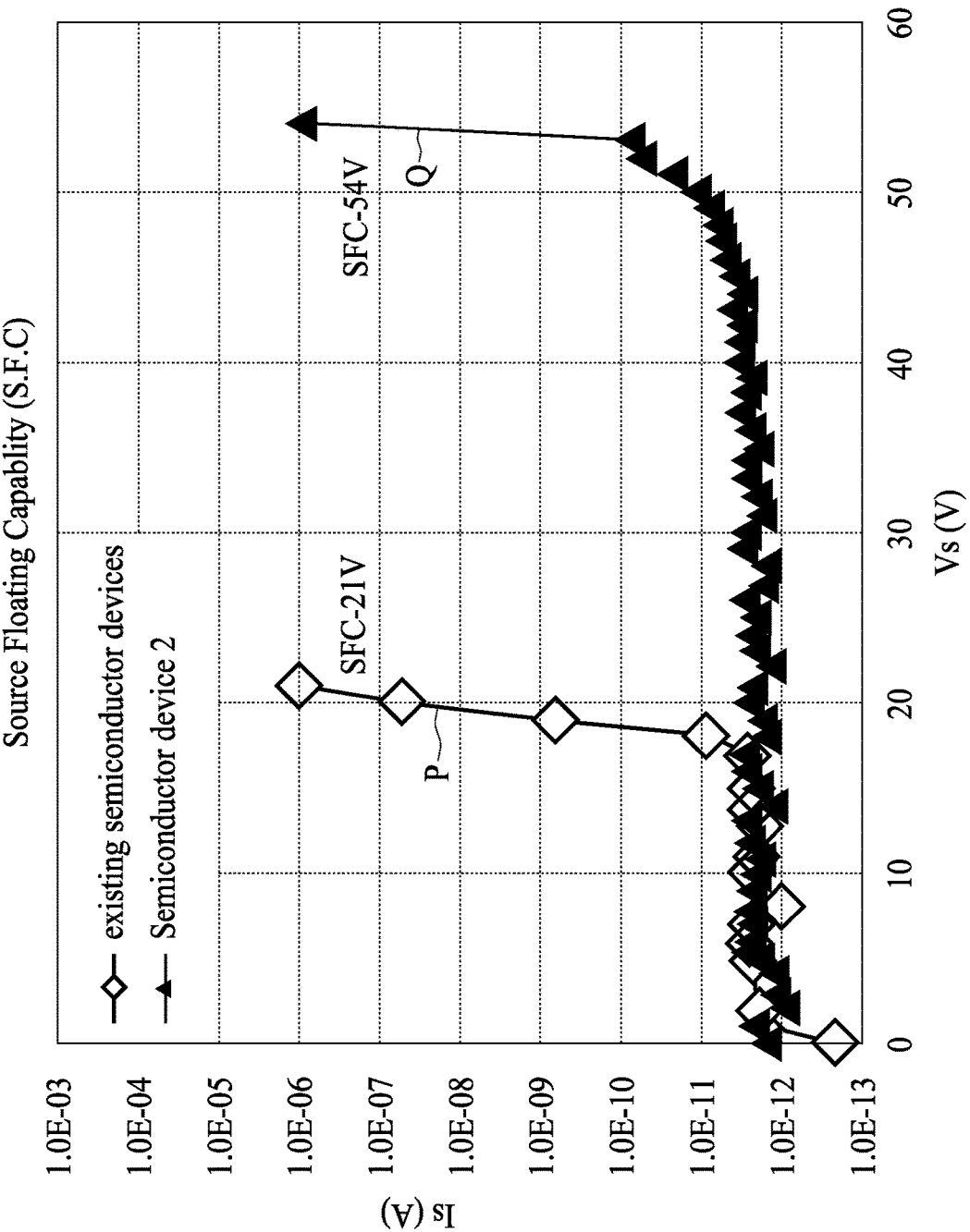
FIG. 5A is a diagram illustrating source floating capability of a transistor according to the present disclosure and an existing transistor, in accordance with some embodiments of the present disclosure.

FIG. 5A is a diagram illustrating source floating capability of the transistor M and an existing transistor, in accordance with some embodiments of the present disclosure. Referring to FIG. 5A, the horizontal axis represents a source voltage (Vs) in volts, and the vertical axis represents a leakage current (Is) in ampere (A). Curve P represents the characteristic of an existing transistor, while curve Q represents the characteristic of the transistor M as shown in FIG. 2. In the existing transistor, an electric field directly affects an isolation component next to a source region of the existing transistor without being weakened by a protective layer, and the isolation component is not biased by a voltage.

As indicated by the curve P, the leakage current Is of the existing transistor does not significantly increase until the source voltage of the existing transistor reaches 21 V. As a result, the source floating capability of the existing transistor is determined to be approximately 21 V. By comparison, as indicated by the curve Q, the leakage current Is of the transistor M does not significantly increase until the source voltage Vs of the transistor M reaches up to 54 V. As a result, the source floating capability of the transistor M is determined to be approximately 54 V, which is approximately 2.5 times of 21 V. Obviously, the source floating capability of the transistor M is better than that of the existing transistor. Therefore, for the same reasons as mentioned above, the transistor M is able to enhance the SFC and has no parasitic power dissipation resulting from a leakage current.

Figure 5B:
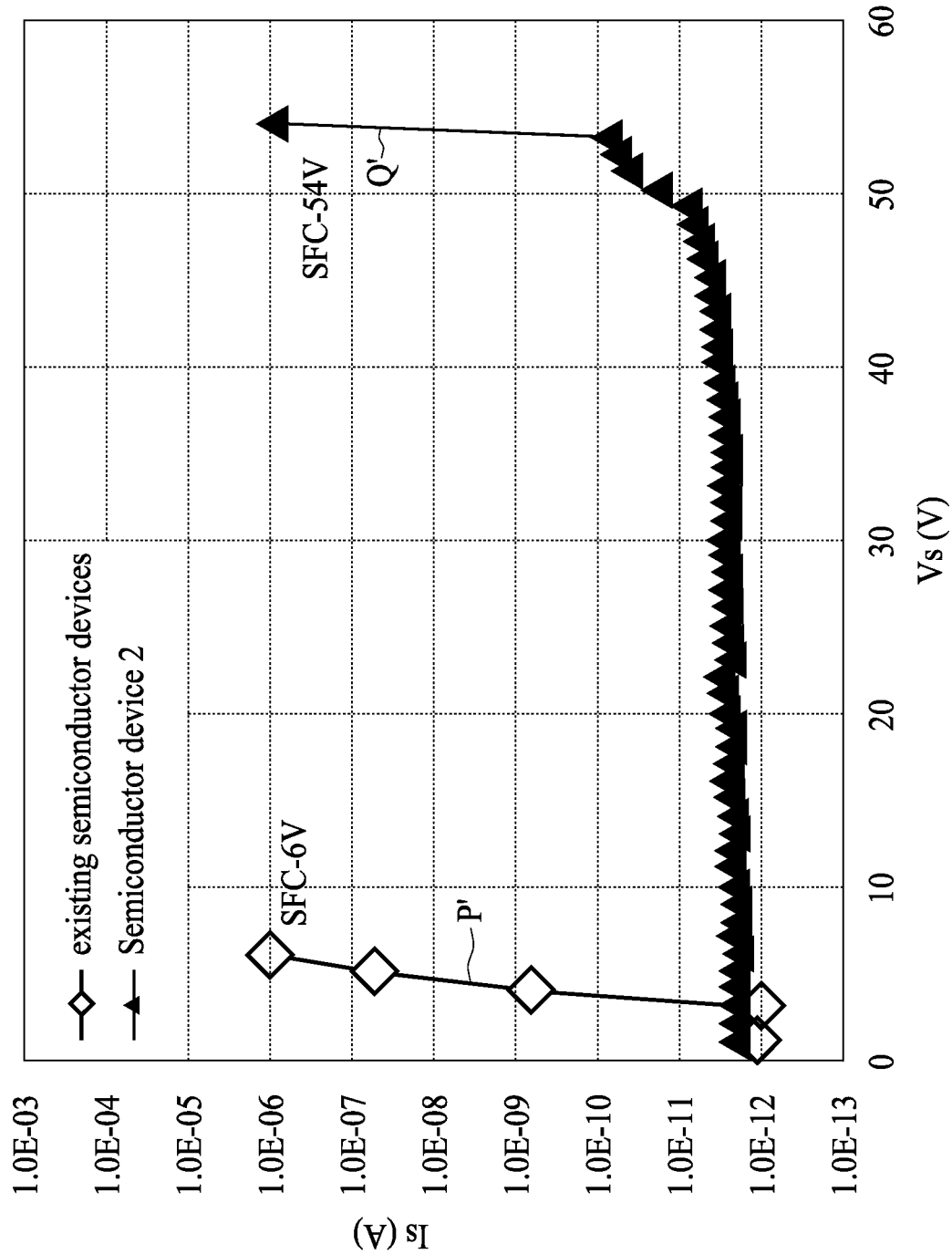
FIG. 5B is a diagram illustrating source floating capability of a transistor according to the present disclosure and an existing transistor, in accordance with some embodiments of the present disclosure.

FIG. 5B is a diagram illustrating source floating capability of the transistor M and an existing transistor, in accordance with some embodiments of the present disclosure. Curve P' represents the characteristic of an existing transistor, while curve Q' represents the characteristic of the transistor M as shown in FIG. 2. The existing transistor and the transistor M are enabled. As indicated by the curve P', the source floating capability of the existing transistor is dramatically decreased from approximately 21 V to approximately 6 V after the existing transistor is enabled. Such phenomenon is called "degradation." Contrarily, as indicated by the curve Q', the source floating capability of the transistor M is kept at approximately 54 V without degradation. Accordingly, the transistor M is able to alleviate the degradation issue and enhance the SFC.

Figure 6A:
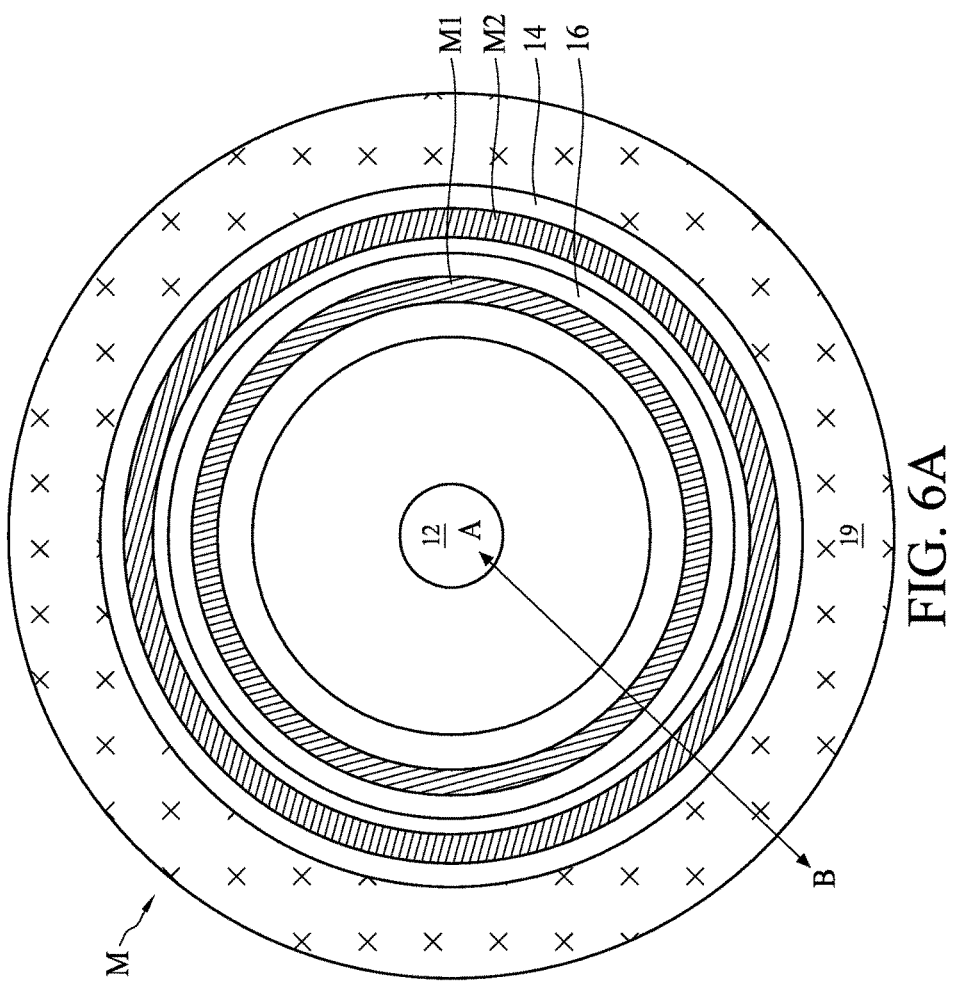
FIG. 6A is a layout top view of a semiconductor device, in accordance with some embodiments of the present disclosure.

FIG. 6A is a layout top view of a semiconductor device 6, in accordance with some embodiments of the present disclosure. Referring to FIG. 6A, the semiconductor device 6 is similar to the semiconductor device 1 described and illustrated with reference to FIG. 1A except that, for example, there is no second conductive layer M2 to couple a drain region 12 of a transistor M to any connection area 7. The second conductive layer M2 takes the form of a ring. Furthermore, the first conductive layer M1 also takes the form of a ring. Moreover, as compared to the layout shown in FIG. 1A, no first conductive layer M1 is removed.

Since no second conductive layer M2 extends across the isolation component 18, no degradation issue may occur. However, as previously discussed, when a voltage is applied to the conductive component 19 surrounding the source region 14, the source floating capability of the transistor M can still be enhanced. In the present embodiment, the conductive component 19 is a continuous ring surrounding the source region 14. In another embodiment, the conductive component 19 is a non-continuous ring.

Figure 6B:
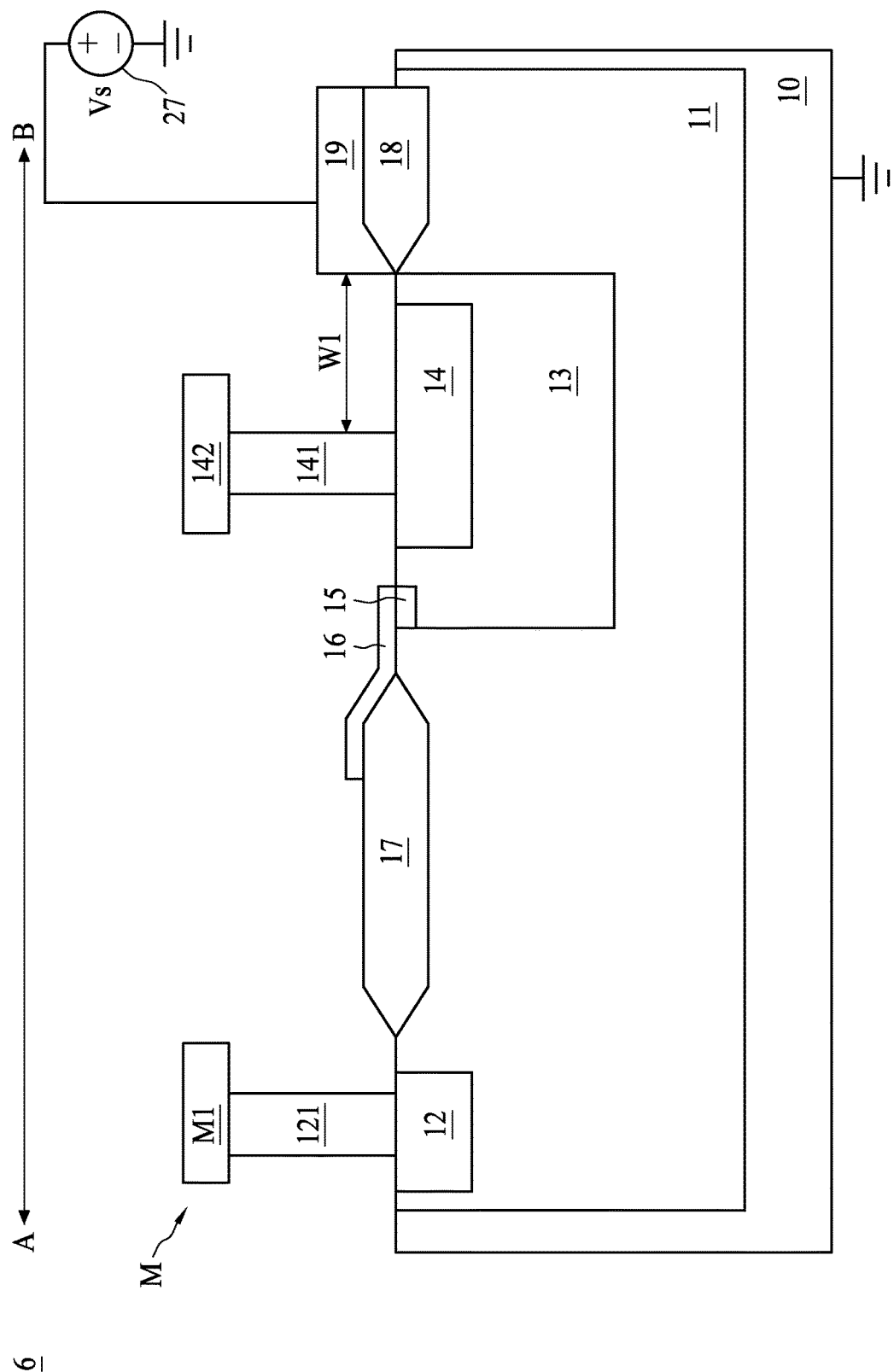
FIG. 6B is a cross-sectional view of the semiconductor device as shown in FIG. 6A taken along a line A-B, in accordance with some embodiments of the present disclosure.

FIG. 6B is a cross-sectional view of the semiconductor device 6 as shown in FIG. 6A taken along a line A-B, in accordance with some embodiments of the present disclosure. Referring to FIG. 6B, the semiconductor device 6 is similar to the semiconductor device 2 described and illustrated with reference to FIG. 2 except that, for example, the semiconductor device 6 is free of second conductive layer M2 extending across the isolation component 18 in the A-B direction.

The voltage source 27 is configured to provide a voltage Vs to the conductive component 19. The conductive component 19 serving as a shield component and raised to the voltage level Vs facilitates accumulation of the charge in the well 11. Accordingly, the source floating capability (SFC) of the transistor M is enhanced. For the similar reasons provided in the embodiment of FIG. 2, as a result of the enhanced source floating capability, leakage current in the transistor M when disabled is reduced or even eliminated. Accordingly, the transistor M has no parasitic power dissipation resulting from the leakage current.

Moreover, the conductive component 19 is spaced apart, by a distance W1, from a contact 141 between the source region 14 and a conductive layer 142, for example, a portion of the first conductive layer M1. Additionally, the conductive component 19 is extended toward the contact 141 in the case that the isolation component 18 includes a LOCOS or FOX structure. Effectively, undesirable effects such as point discharge resulting from a bird's beak at the edge of the LOCOS or FOX can be avoided.

Figure 7:
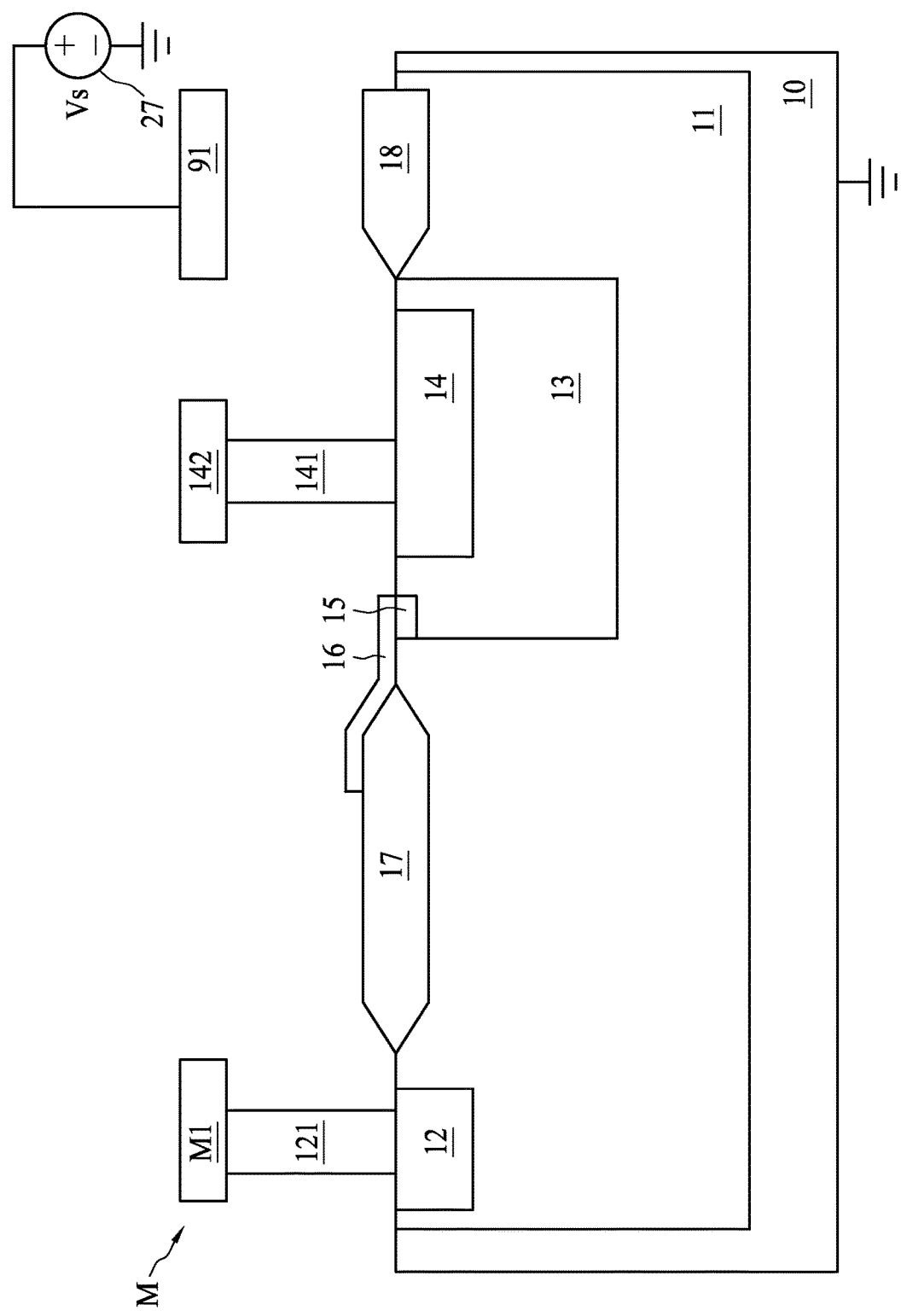
FIG. 7 is a diagram of a semiconductor device, in accordance with some embodiments of the present disclosure.

FIG. 7 is a diagram of a semiconductor device 7, in accordance with some embodiments of the present disclosure. Referring to FIG. 7, the semiconductor device 7 is similar to the semiconductor device 6 described and illustrated with reference to FIG. 6B except that, for example, the semiconductor device 7 replaces the conductive component 19 disposed on the isolation component 18 with a conductive component 91 extending over the isolation component 18.

The voltage source 27 is configured to provide a voltage Vs to the conductive component 91. The conductive component 91 serving as a shield component and raised to the voltage level Vs facilitates accumulation of charge in the well 11. Accordingly, the source floating capability (SFC) of the transistor M is enhanced. For the similar reasons provided in the embodiment of FIG. 2, as a result of the enhanced source floating capability, leakage current in the transistor M when disabled is reduced or even eliminated. Accordingly, the transistor M has no parasitic power dissipation resulting from the leakage current.

Figure 8:
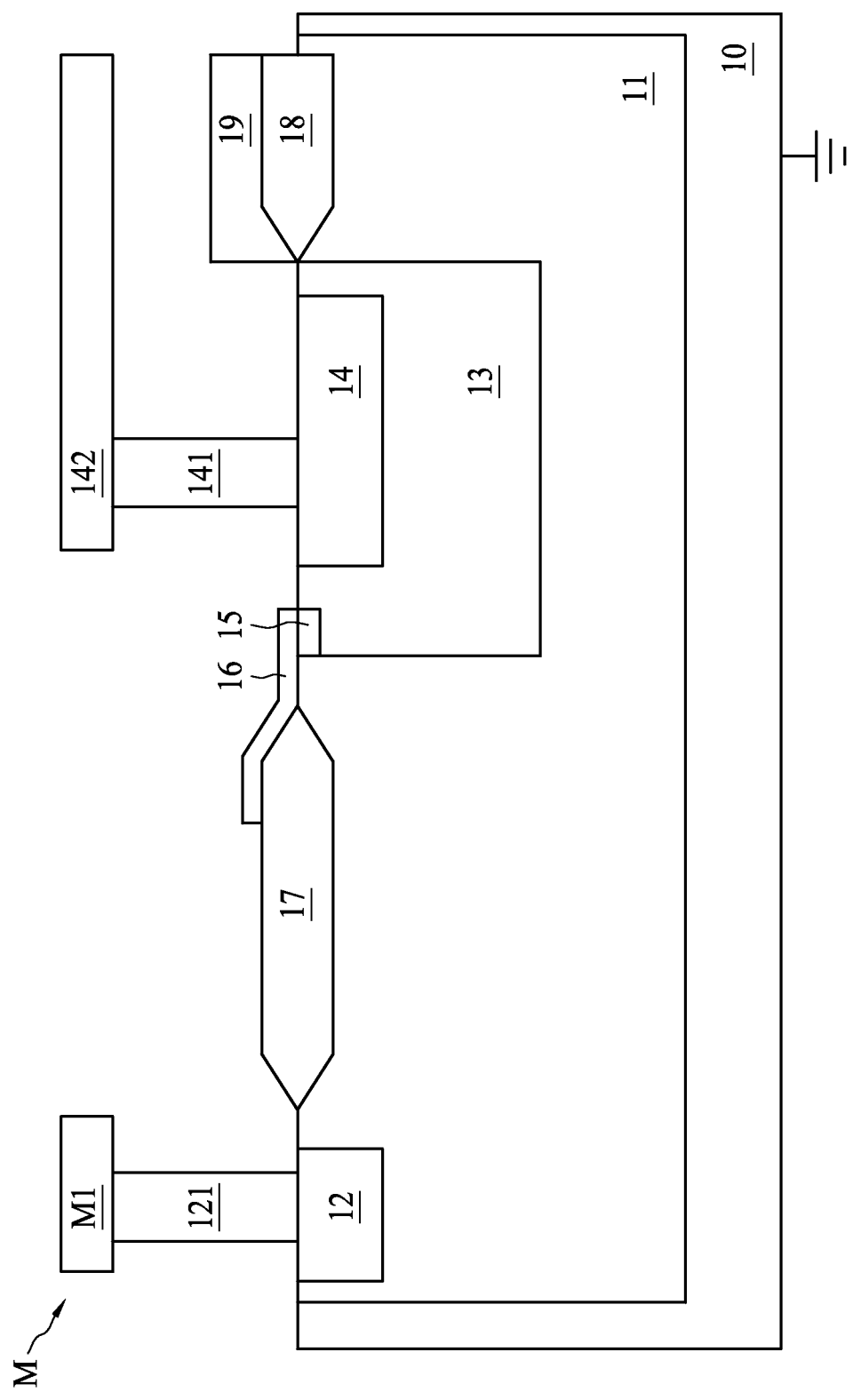
FIG. 8 is a diagram of a semiconductor device, in accordance with some embodiments of the present disclosure.

FIG. 8 is a diagram of a semiconductor device 8, in accordance with some embodiments of the present disclosure. Referring to FIG. 8, the semiconductor device 8 is similar to the semiconductor device 6 described and illustrated with reference to FIG. 6B except that, for example, the conductive layer 142 extends over the isolation component 18. In operation, when the transistor M is enabled, the conductive layer 142 raised to a voltage level as the source region 14 facilitates accumulation of charge in the well 11. Accordingly, the source floating capability (SFC) of the transistor M is enhanced. For the similar reasons provided in the embodiment of FIG. 2, as a result of the enhanced source floating capability, leakage current in the transistor M when disabled is reduced or even eliminated. Accordingly, the transistor M has no parasitic power dissipation resulting from the leakage current.

Figure 9:
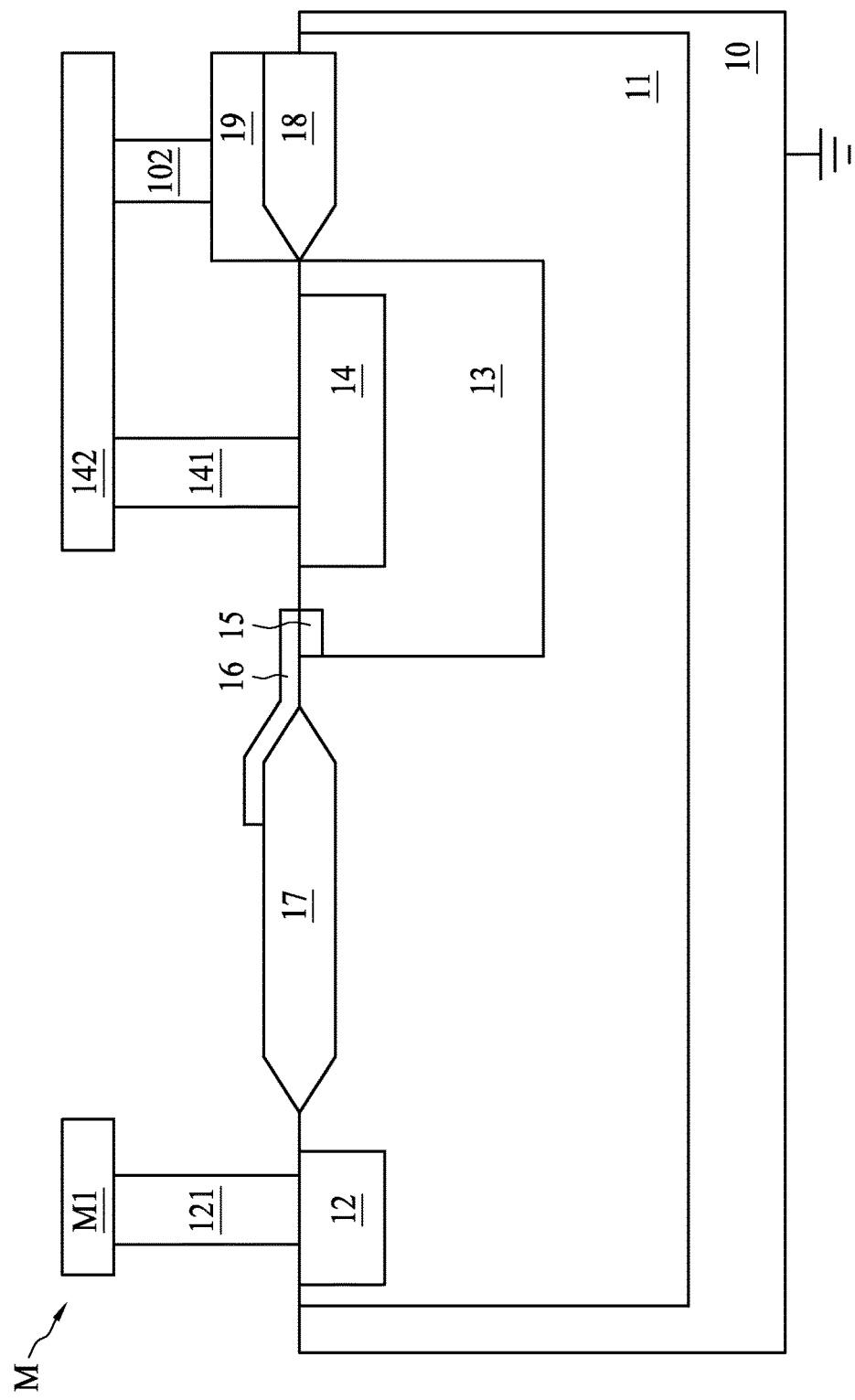
FIG. 9 is a diagram of a semiconductor device, in accordance with some embodiments of the present disclosure.

FIG. 9 is a diagram of a semiconductor device 9, in accordance with some embodiments of the present disclosure. Referring to FIG. 9, the semiconductor device 9 is similar to the semiconductor device 8 described and illustrated with reference to FIG. 9 except that, for example, the semiconductor device 9 includes a via 102 between the conductive component 19 and the extended conductive layer 142.

The conductive component 19 is coupled through the via 102, the conductive layer 142 and the via 141 to the source region 14. As such, when the transistor M is enabled, the conductive layer 142 raised to a voltage level as the source region 14 facilitates accumulation of charge in the well 11. Accordingly, the source floating capability (SFC) of the transistor M is enhanced. For the similar reasons provided in the embodiment of FIG. 2, as a result of the enhanced source floating capability, leakage current in the transistor M when disabled is reduced or even eliminated. Accordingly, the transistor M has no parasitic power dissipation resulting from the leakage current.

Figure 10:
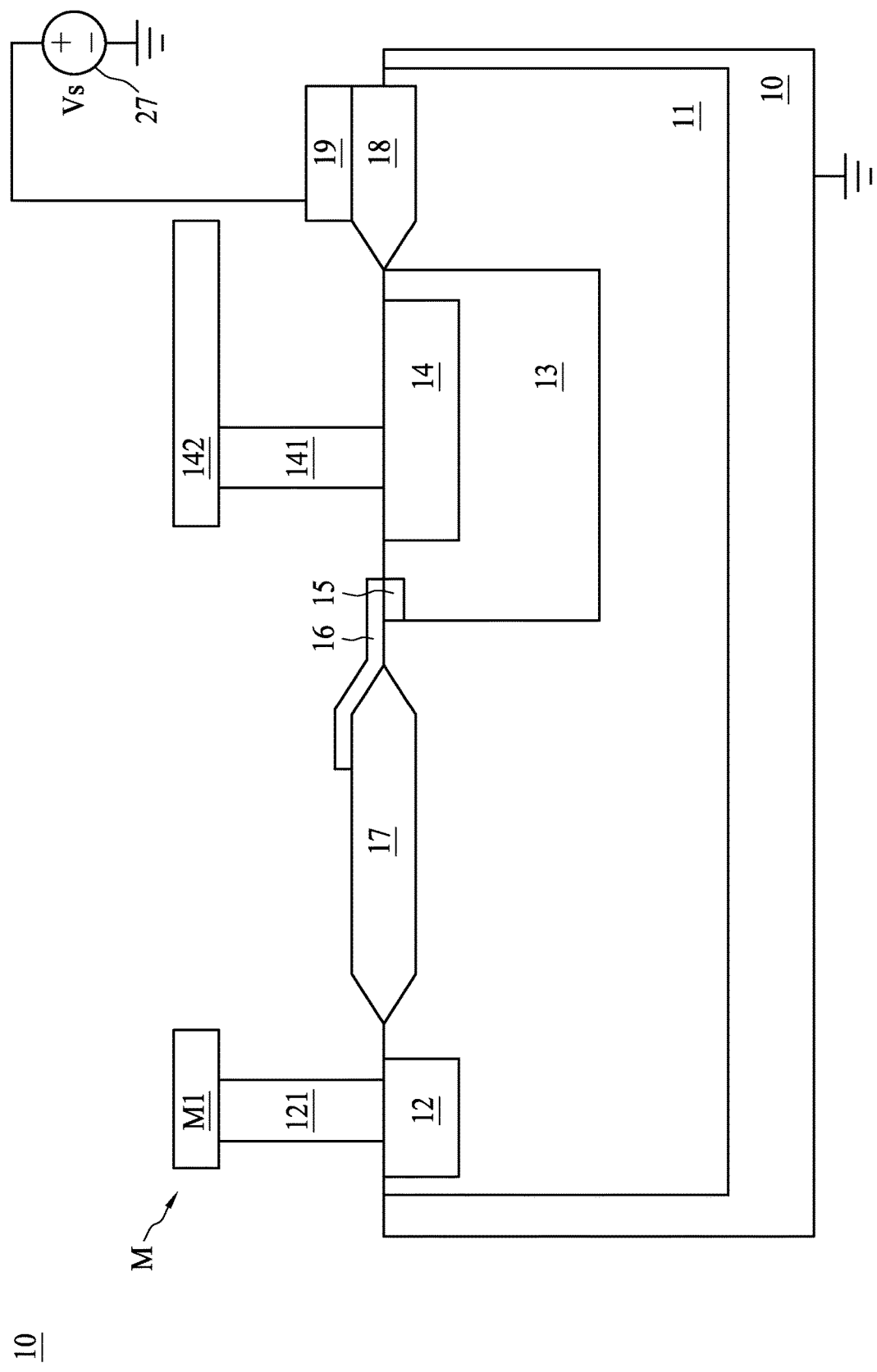
FIG. 10 is a diagram of a semiconductor device, in accordance with some embodiments of the present disclosure.

FIG. 10 is a diagram of a semiconductor device 10, in accordance with some embodiments of the present disclosure. Referring to FIG. 10, the semiconductor device 10 is similar to the semiconductor device 6 described and illustrated with reference to FIG. 6B except, for example, the arrangement of the conductive layer 142 and the conductive component 19. Specifically, the conductive component 19 disposed on the isolation component 18 covers a portion of the isolation component 18, while the conductive layer 142 is extended over the isolation component to overlap another portion of the isolation component 18. In the present embodiment, one portion of the isolation component 18 is covered by the conductive component 19, and the other portion of the isolation component 18 is overlapped by the extended conductive layer 142.

As discussed in the embodiments of FIGS. 6B and 8, the conductive component 19 and the conductive layer 142 may be raised to a voltage level to facilitate charge accumulation in the well 11. Accordingly, the source floating capability (SFC) of the transistor M is enhanced. For the similar reasons provided in the embodiment of FIG. 2, as a result of the enhanced source floating capability, leakage current provided in the transistor M when disabled is reduced or even eliminated and thus the transistor M has no parasitic power dissipation resulting from the leakage current.

Figure 11A:
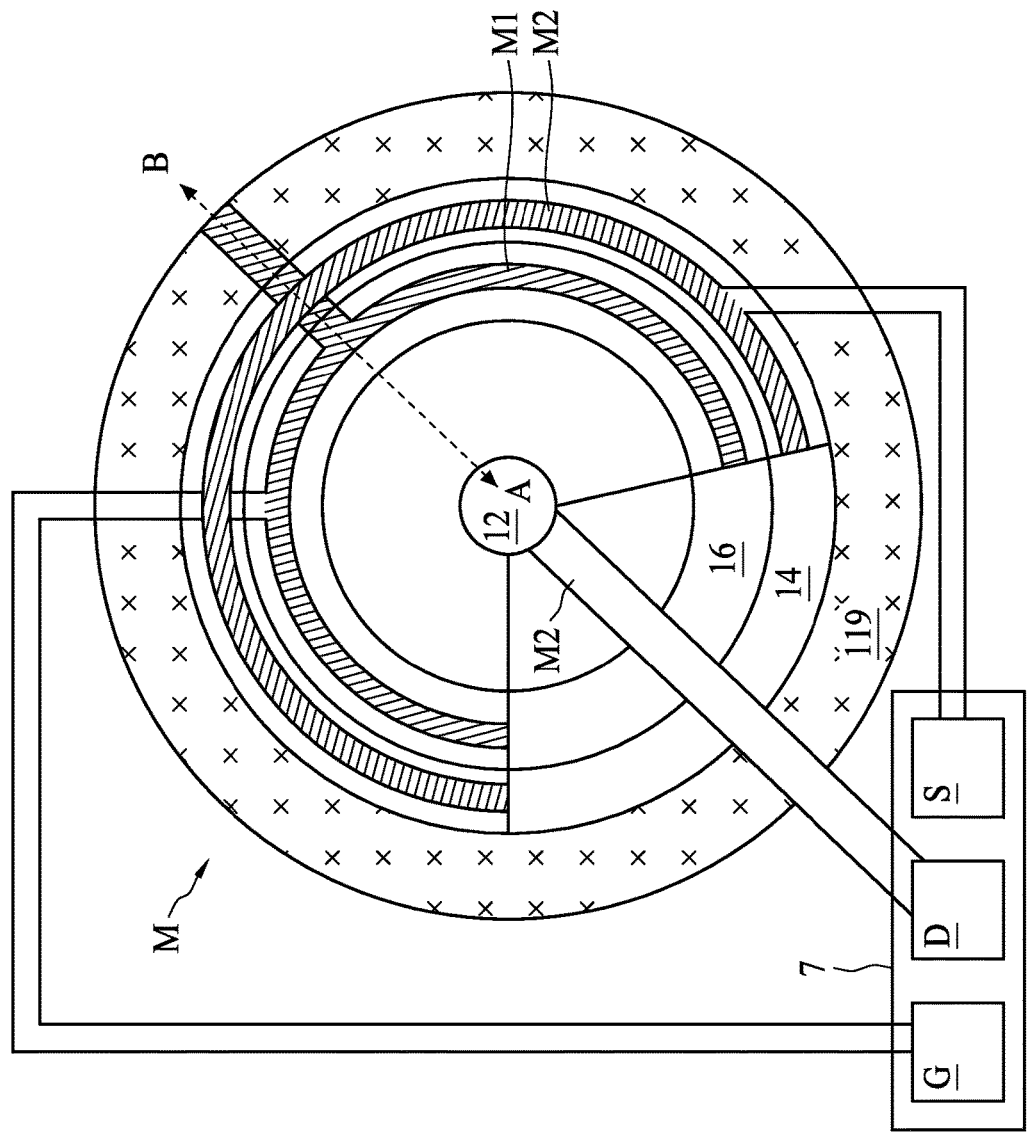
FIG. 11A is a layout top view of a semiconductor device, in accordance with some embodiments of the present disclosure.

FIG. 11A is a layout top view of a semiconductor device 11, in accordance with some embodiments of the present disclosure. Referring to FIG. 11A, the semiconductor device 11 is similar to the semiconductor device 1 described and illustrated with reference to FIG. 1A except that, for example, a conductive component 119, which takes the form of a ring, replaces the conductive component 19, and a first conductive layer M1 electrically couples the source region 14 to the conductive component 119, which will be described and illustrated in detail with reference to FIG. 11B.

Figure 11B:
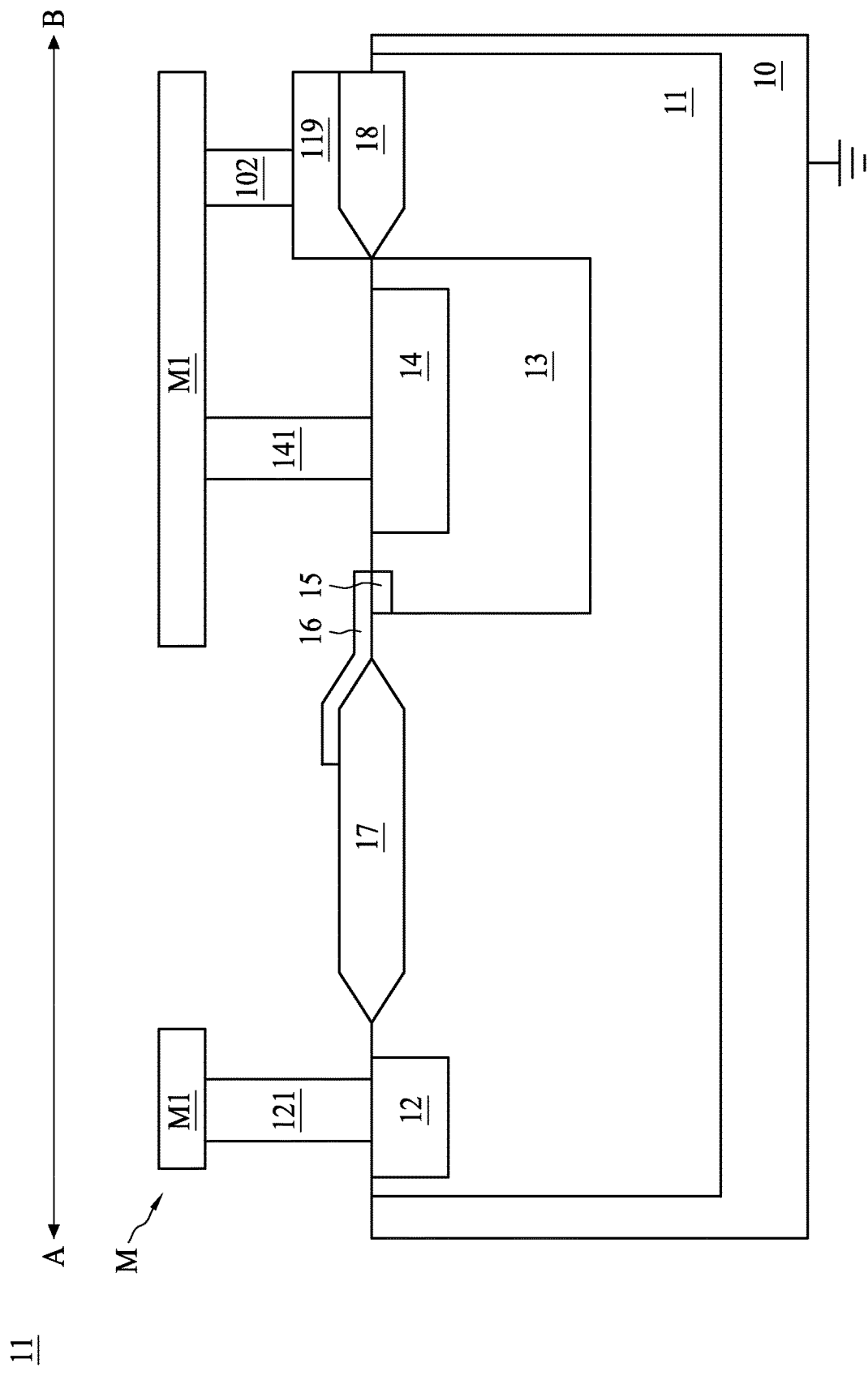
FIG. 11B is a cross-sectional view of the semiconductor device shown in FIG. 11A taken along a line A-B, in accordance with some embodiments of the present disclosure.

FIG. 11B is a cross-sectional view of the semiconductor device 11 shown in FIG. 11A taken along a line A-B, in accordance with some embodiments of the present disclosure. Referring to FIG. 11B, the cross-sectional view of the semiconductor device 11 is similar to that of the semiconductor device 9 described and illustrated with reference to FIG. 9 except that, for example, the first conductive layer M1 replaces the conductive layer 142 shown in FIG. 9.

With the first conductive layer M1, the conductive component 119 is biased at the same voltage level as the source region 14. Accordingly, the source floating capability (SFC) of a transistor M is enhanced. For the similar reasons provided in the embodiment of FIG. 2, as a result of the enhanced source floating capability, leakage current in the transistor M when disabled is reduced or even eliminated. Accordingly, the transistor M has no parasitic power dissipation resulting from the leakage current.

Some embodiments have one or a combination of the following features and/or advantages. In some embodiments, a semiconductor device includes a transistor, an isolation component, and a conductive layer. The transistor includes a source region and a drain region. The isolation component surrounds the source region. The conductive layer is configured for interconnection of the drain region. The conductive component is between the conductive layer and the isolation component, configured to shield the isolation component from an electric field over the isolation component.

In some embodiments, a semiconductor device includes a transistor, an isolation component and a conductive component. The transistor includes a source region in a first well within a second well and a drain region in the second well. The isolation component surrounds the source region. The conductive component is configured to facilitate accumulation of charge in the second well. The charge has a same electrical type as the majority carrier of the second well.

In some embodiments, a semiconductor device includes an NMOS transistor, a first conductive component and a second conductive component. The NMOS transistor includes a source region in a p-well in an n-well and a drain region in the n-well. The isolation component surrounds the source region. The first conductive component is configured to facilitate accumulation of negative charge in the n-well. The negative charge has a same electrical type as the majority carrier of the n-well. The second conductive component is configured to facilitate accumulation of the negative charge in the n-well The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a transistor including:
        a source region; and
        a drain region being surrounded by the source region;
    an isolation component surrounding the source region;
    a conductive layer configured for interconnection of the drain region; and
    a conductive component between the conductive layer and the isolation component, configured to shield the isolation component from an electric field over the isolation component.

2. The semiconductor device of claim 1, wherein the conductive component is disposed on the isolation component.

3. The semiconductor device of claim 2, wherein the conductive component covers the entire isolation component.

4. The semiconductor device of claim 2, wherein the conductive component covers a portion of the isolation component.

5. The semiconductor device of claim 1, wherein the conductive component extends onto the source region.

6. The semiconductor device of claim 1, wherein the conductive component is configured to be biased at a voltage level.

7. The semiconductor device of claim 1, wherein the conductive component extends over the isolation component.

8. The semiconductor device of claim 7, wherein the conductive component is configured to be biased at a voltage level.

9. The semiconductor device of claim 1, wherein the conductive component includes a material selected from one of poly and metal.

10. A semiconductor device, comprising:
a transistor includes:
 a source region in a first well within a second well; and
 a drain region in the second well;
an isolation component surrounding the source region; and
a conductive component configured to facilitate accumulation of charge in the second well, wherein the charge has a same electrical type as the majority carrier of the second well.

11. The semiconductor device of claim 10, wherein the conductive component is configured to be biased at a voltage level.

12. The semiconductor device of claim 10, wherein the conductive component is disposed on the isolation component.

13. The semiconductor device of claim 10, wherein the conductive component covers the entire isolation component.

14. The semiconductor device of claim 10, wherein the conductive component covers a portion of the isolation component.

15. The semiconductor device of claim 10, wherein the conductive component extends onto the source region.

16. The semiconductor device of claim 10, wherein the conductive component is coupled to the source region.

17. The semiconductor device of claim 16 further comprising a second conductive component on the isolation component.

18. A semiconductor device, comprising:
an NMOS transistor includes:
 a source region in a p-well in an n-well; and
 a drain region in the n-well;
an isolation component surrounding the source region;
a first conductive component configured to facilitate accumulation of negative charge in the n-well, wherein the negative charge has a same electrical type as the majority carrier of the n-well; and
a second conductive component configured to facilitate accumulation of the negative charge in the n-well.

19. The semiconductor device of claim 18, wherein the first conductive component is extended over the isolation component and coupled to the source region via a contact.

20. The semiconductor device of claim 18, wherein the second conductive component is disposed on the isolation component and is configured to be biased at a voltage level.

* * * * *